(12) United States Patent
Fukazawa et al.

(10) Patent No.: US 8,765,233 B2
(45) Date of Patent: *Jul. 1, 2014

(54) METHOD FOR FORMING LOW-CARBON CVD FILM FOR FILLING TRENCHES

(75) Inventors: Atsuki Fukazawa, Tama (JP); Hisashi Tazawa, Tama (JP); Shigeyuki Onizawa, Tama (JP)

(73) Assignee: ASM Japan K.K., Tokyo (JP)

( * ) Notice: Subject to any disclaimer, the term of this patent is extended or adjusted under 35 U.S.C. 154(b) by 1114 days.

This patent is subject to a terminal disclaimer.

(21) Appl. No.: 12/331,309

(22) Filed: Dec. 9, 2008

(65) Prior Publication Data

US 2010/0143609 A1    Jun. 10, 2010

(51) Int. Cl.
*C23C 16/22* (2006.01)

(52) U.S. Cl.
USPC ............................ 427/585; 438/778; 438/792

(58) Field of Classification Search
USPC ........................................................ 427/585
See application file for complete search history.

(56) References Cited

U.S. PATENT DOCUMENTS

| | | | |
|---|---|---|---|
| 5,204,141 A * | 4/1993 | Roberts et al. | 427/255.37 |
| 5,314,724 A * | 5/1994 | Tsukune et al. | 427/489 |
| 5,393,815 A | 2/1995 | Takeda et al. | |
| 5,487,920 A | 1/1996 | Lopata et al. | |
| 5,922,411 A | 7/1999 | Shimizu et al. | |
| 6,352,945 B1 | 3/2002 | Matsuki et al. | |
| 6,383,955 B1 | 5/2002 | Matsuki et al. | |
| 6,403,486 B1 | 6/2002 | Lou | |
| 6,410,463 B1 | 6/2002 | Matsuki | |
| 6,432,846 B1 | 8/2002 | Matsuki et al. | |
| 6,436,822 B1 | 8/2002 | Towle | |
| 6,455,445 B2 | 9/2002 | Matsuki | |
| 6,514,880 B2 | 2/2003 | Matsuki et al. | |
| 6,740,602 B1 | 5/2004 | Hendriks et al. | |
| 6,784,123 B2 | 8/2004 | Matsuki et al. | |
| 6,818,570 B2 | 11/2004 | Tsuji et al. | |
| 6,835,664 B1 | 12/2004 | Sarigiannis et al. | |
| 6,881,683 B2 | 4/2005 | Matsuki et al. | |
| 6,890,869 B2 | 5/2005 | Chung | |

(Continued)

FOREIGN PATENT DOCUMENTS

| | | |
|---|---|---|
| EP | 1 225 194 A2 | 7/2002 |
| JP | 2006-054353 | 2/2006 |

OTHER PUBLICATIONS

A. J. Kalkman et al., SiOF$_x$ and SiO$_2$ deposition in an ECR-HDP reactor: Tool characterization and film analysis, Microelectronic Engineering 37-38(1999) 271-276.

(Continued)

*Primary Examiner* — Roy King
*Assistant Examiner* — Xiaowei Su
(74) *Attorney, Agent, or Firm* — Knobbe Martens Olson & Bear LLP

(57) ABSTRACT

A method of forming a low-carbon silicon-containing film by CVD on a substrate having trenches includes: introducing a silicon-containing compound having three or less hydrocarbon units in its molecule and having a boiling temperature of 35° C. to 220° C.; applying RF power to the gas; and depositing a film on a substrate having trenches wherein the substrate is controlled at a temperature such that components of the silicon-containing compound are at least partially liquidified on the substrate, thereby filling the trenches with the film.

14 Claims, 6 Drawing Sheets

(56) References Cited

U.S. PATENT DOCUMENTS

| | | | |
|---|---|---|---|
| 7,064,088 B2 | 6/2006 | Hyodo et al. | |
| 7,229,935 B2 * | 6/2007 | Fukazawa et al. | 438/788 |
| 7,354,873 B2 | 4/2008 | Fukazawa et al. | |
| 7,541,297 B2 * | 6/2009 | Mallick et al. | 438/778 |
| 7,651,959 B2 * | 1/2010 | Fukazawa et al. | 438/786 |
| 7,781,352 B2 * | 8/2010 | Fukazawa et al. | 438/792 |
| 7,825,038 B2 * | 11/2010 | Ingle et al. | 438/778 |
| 2001/0055889 A1 | 12/2001 | Iyer | |
| 2003/0100175 A1 | 5/2003 | Nobutoki et al. | |
| 2003/0194880 A1 | 10/2003 | Singh et al. | |
| 2004/0137757 A1 | 7/2004 | Li et al. | |
| 2005/0129932 A1 | 6/2005 | Briley | |
| 2006/0014399 A1 | 1/2006 | Joe | |
| 2006/0110931 A1 | 5/2006 | Fukazawa et al. | |
| 2006/0228866 A1 | 10/2006 | Ryan et al. | |
| 2006/0240652 A1 | 10/2006 | Mandal | |
| 2006/0258176 A1 * | 11/2006 | Fukazawa et al. | 438/787 |
| 2007/0004204 A1 | 1/2007 | Fukazawa et al. | |
| 2007/0065597 A1 | 3/2007 | Kaido et al. | |
| 2007/0212847 A1 * | 9/2007 | Ingle et al. | 438/407 |
| 2007/0289534 A1 | 12/2007 | Lubomirsky et al. | |
| 2008/0076266 A1 | 3/2008 | Fukazawa et al. | |
| 2008/0305648 A1 | 12/2008 | Fukazawa et al. | |
| 2009/0075490 A1 * | 3/2009 | Dussarrat | 438/787 |

OTHER PUBLICATIONS

W. J. Lee et al., Device Isolation Technology on Semiconductor Substrate, U.S. Appl. No. 12/130,522, filed May 30, 2008.

* cited by examiner

METHOD FOR FORMING LOW-CARBON CVD FILM FOR FILLING TRENCHES

BACKGROUND

1. Field of the Invention

The present invention generally relates to a method for forming a low-carbon CVD film for filling STI structures, for example.

2. Description of the Related Art

Conventional gap-filling methods using a cooling susceptor include those using siloxane material and silazane material, where fluidity can be generated easily as a result of bond of Si and hydrocarbon. On the other hand, post-treatment applied after film forming causes carbon to dissociate and the film density in STI trenches to become lower (lower density here refers to opening of numerous void-like holes or shrinking of film in trenches having surface irregularities), while at the same time the film quality also drops (leading to high leak current, poor chemical resistance and other negative results). As a result, problems occur such as the film becoming vulnerable to damage due to exposure to hydrogen fluoride cleaning solution.

In light of the aforementioned problems, the inventors examined materials having less carbon content. When $SiH_4$ and $NH_3$ were combined and the discharge distance in the plasma CVD apparatus was adjusted to 16 mm or less, it was possible to generate fluidity despite the boiling point of $SiH_4$ being −111.9° C. In this case, fluidity could be generated by suppressing the reactivity because the carbon content was zero, and accordingly the viscosity was high and there was dependence on the pattern size. In order to promote fluidity, the inventors also examined the possibility of lowering the viscosity by adding hydrocarbon material or lowering the susceptor temperature. However, the former method was considered inappropriate due to concerns over low density during post-treatment, while the latter method was determined not appropriate, either, because it would increase volatility. Incidentally, the above statements are not provided as known facts, but solely as information that should be explained prior to describing the present invention.

To improve the quality of filling film, it is important to reduce the carbon content in the materials to be used. On the other hand, how to generate fluidity is also an important point. If materials that do not contain carbon are combined, the process parameter margins are expected to narrow if fluidity is to be improved.

SUMMARY

In an embodiment wherein one or more of the problems described above can be solved, a method of forming a low-carbon silicon-containing film by CVD on a substrate having trenches may comprise: (i) introducing a process gas into a reaction chamber, said process gas comprising a gas of a silicon-containing compound having three or less hydrocarbon units in its molecule and having a boiling temperature of 35° C. to 220° C.; (ii) applying RF power to the process gas; and (iii) depositing a film on a substrate having trenches wherein the substrate is controlled, or maintained, at a temperature such that components of the silicon-containing compound are at least partially liquidified on the substrate, thereby filling the trenches with a material constituting the film. In an embodiment, the "low-carbon silicon-containing film" includes a carbon free silicon-containing film or a substantially or nearly carbon free silicon-containing film. In another embodiment, the film is a carbon and silicon-containing film and is deposited using at least the silicon-compound as a precursor.

Embodiments include, but are not limited to, the following:

In an embodiment, the hydrocarbon units may be selected from the group consisting of $CH_2$, $CH_3$, $C_2H_4$, $C_2H_5$, $C_3H_6$, and $C_3H_7$.

In any of the foregoing embodiments, the silicon-containing compound may have Si—N, Si—C, or Si—Si bonds in its main skeleton.

In any of the foregoing embodiments, the silicon-containing compound may have two or less hydrocarbon units. In an embodiment, the silicon-containing compound may be selected from the group consisting of 1,4-disilanebutane, cyclopentasilane, cyclotrisilazane, and 1,4,7-trisilaheptane.

In any of the foregoing embodiments, in the step of depositing the film the substrate may be controlled at a temperature of −50° C. to 100° C., preferably −50° C. to 50° C.

In any of the foregoing embodiments, the process gas may further comprise an inert gas. In an embodiment, a flow rate of the inert gas may be lower after the step of applying the RF power than before the step of applying the RF power, and a pressure of the reaction chamber may be higher after the step of applying the RF power than before the step of applying the RF power. In an embodiment, a decrease of the flow rate of the inert gas and an increase of the pressure may begin substantially at or nearly at a moment of starting application of the RF power. In another embodiment, a decrease of the flow rate of the inert gas and an increase of the pressure may begin after starting application of the RF power.

In any of the foregoing embodiments, the method may further comprise in-situ oxidizing the film after the step of depositing the film in the same reaction chamber. In an embodiment, the in-situ oxidization may be an oxygen plasma treatment. In an embodiment, the step of depositing the film and the step of oxidizing the film may be repeated until the trenches are fully filled.

In any of the foregoing embodiments, the process gas may further comprise an additive gas that contains hydrocarbon. The hydrocarbon can act as a carbon source for the carbon and silicon-containing film.

In any of the foregoing embodiments, the process gas may consist of the silicon-containing compound and an inert gas.

In any of the foregoing embodiments, the method may further comprise annealing the film as a post deposition treatment to remove Si—H and C—H from the film. In an embodiment, the annealing may comprise multiple different anneal steps.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1A:
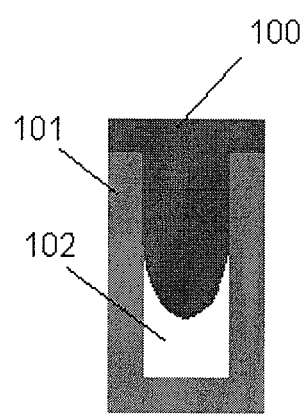
FIGS. 1A, 1B, and 1C are schematic cross sections of trenches filled with film material.

The present invention will be explained in detail with reference to embodiments of the present invention which are not intended to limit the present invention.

1) The first embodiment provides a method for forming a Si insulation film having filling characteristics by using plasma CVD equipped with a cooling susceptor, wherein such method is characterized in that, for the purpose of suppressing production of carbon impurities (for example, CxHy, which is called hydrocarbon) during film forming, a Si-containing material that contains only 0, 1, 2 or 3 (or 0, 1 or 2 in an embodiment) hydrocarbon units in the molecule (for example, a unit expressed by the general formula CxHy typically bonded to Si, where $CH_2$, $CH_3$, $C_2H_4$, $C_2H_5$, $C_3H_6$, $C_3H_7$, etc., are all considered individual units) is used, this material has a boiling point of 35 to 220° C., and film is formed at temperatures not exceeding the boiling point of the material, in order to improve the film shrinkage caused by carbon. Here, there are four fluidity generation parameters including the susceptor temperature, reaction chamber pressure, radio-frequency power output, and material flow rate. By the way, suppression of production of carbon impurities in such film can be checked by FT-IR, for example.

Under the conventional fluidity process, a material containing a large amount of hydrocarbon is used to ensure fluidity and thereby utilize the solvent function of the material. If the carbon content is lowered, however, fluidity is reduced and thus forming film under the normal conditions may become difficult. In the aforementioned embodiment, however, the four process parameters mentioned above are controlled to achieve fluidization.

In an embodiment, no material is used other than low-carbon, Si-containing materials mentioned above.

2) This embodiment is a method according to 1) above, wherein such method ensures excellent film quality in terms of fluidity and heat resistance, by adjusting the film forming conditions to a susceptor temperature range of −50 to 50° C., reaction chamber pressure range of 133 to 1333 Pa (or 266 Pa or more in an embodiment, or especially 450 to 933 Pa in an embodiment), radio-frequency power output range of 10 to 200 W (or 10 to 150 W in an embodiment, or especially 10 to 50 W in an embodiment), and material flow rate range of 1 to 400 sccm (or 25 to 300 sccm in an embodiment, or especially 30 to 100 sccm in an embodiment). In an embodiment, the flow rate of inert gas is adjusted to more than five times the flow rate of material gas.

3) This embodiment is a method according to 1) or 2) above, wherein such method is characterized in that an initial film improvement step is inserted before the film forming step for the purpose of improving the quality of deposited film that was produced by the reaction triggered by plasma.

The initial film improvement step is implemented between the gas setting step (gas flow rate stabilization or condition stabilization step) and film forming step, and provides a transitional step leading to the film forming step. In the gas setting step, RF power is not applied. The initial film improvement step is started when application of RF power is started, continues until the flow rate and pressure of He or other inert gas stabilize at the values specified for the film forming step, and ends once stabilized values are obtained. Accordingly, the initial film improvement step uses gases similar to those used in the film forming step and is implemented inside the same reactor.

The conditions used in the initial film improvement step in an embodiment are as follows (indicated by averages in the step): Pressure: 133 to 600 Pa, additive gas flow rate: 1 to 10 sccm, material gas flow rate: 10 to 100 sccm, and RF power output: 10 to 100 (RF frequency: 13.56 to 27.12 MHz). Although film is also formed in the initial film improvement step, the thickness of the film formed in this step is approx. 10 to 100 nm in an embodiment.

4) This embodiment is a method according to any one of 1) to 3) above, wherein such method is characterized in that film quality is enhanced in and impurities removed from STI trenches by implementing a combination of film forming process and post-treatment at least twice (typically twice or three times, where the exact number of repetitions varies also according to the film thickness), without depositing filling film only in a single film forming process. If trenches are filled by repeating the film forming process multiple times, each sequence comprising film forming process and post-treatment (including partial post-treatment, such as post-treatment comprising heat treatment at up to 400° C.) is performed independently and repeated.

5) This embodiment is a method according to any one of 1) to 4) above, wherein such method is characterized in that, in consideration of the quality of foundation film, a plasma process that uses any one or combination of $O_2$ and other oxidizing gases (at a flow rate of 0.1 to 1 SLM, for example), $N_2$ and other nitrogen gases (at a flow rate of 0.1 to 10 SLM, for example) and He and other inert gases (at a flow rate of 0.1 to 2 SLM, for example) is performed before filling film is deposited (as a pre-treatment step) (where the plasma process is performed at a RF output of 50 to 1000 W, pressure of 133 to 1333 Pa, temperature of −50 to 50° C., and processing time of 10 to 600 seconds, for example), or a process that uses active oxygen obtained by introducing oxygen gas (at a flow rate of 0.1 to 5 SLM, for example) from the RPU is performed (at a processing time of 10 to 600 seconds, pressure of 133 to 1333 Pa, and temperature of −50 to 50° C., for example), on the substrate before film is formed.

In the foregoing, "in consideration of the quality of foundation film" refers to using $O_2$ plasma if the foundation is SiN so as to ensure hydrophilicity, or using He if the foundation is SiO.

6) This embodiment is a method according to any one of 1) to 5) above, wherein such method is characterized in that the base structure of the material is a linear-chain or cyclic structure based on Si—R—Si, R—Si—Si—R(R═N or CxHy), Si—Si or Si—N, and that the boiling point of the material is 35 to 220° C. To be specific, the following materials can be used, for example:

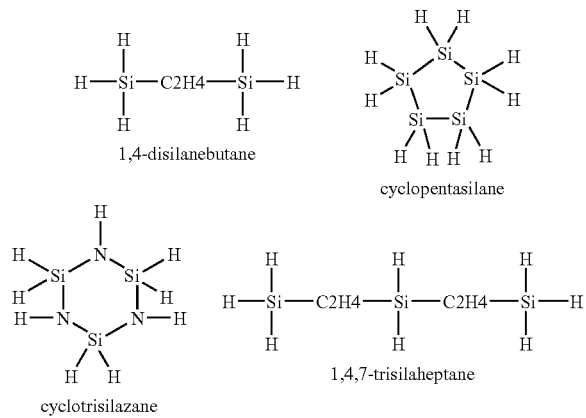

1,4-disilanebutane cyclopentasilane cyclotrisilazane 1,4,7-trisilaheptane

7) This embodiment is a method according to any one of 1) to 6) above, wherein such method is characterized in that hydrocarbon gas such as SixNyCzHa or CxHy (where x, y, z and a are arbitrary natural numbers) is introduced as additive gas for the purpose of improving filling characteristics. To be specific, the following material can be used:

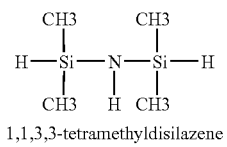

1,1,3,3-tetramethyldisilazene

8) This embodiment is a method according to any one of 1) to 7) above, wherein such method is characterized in that, as a method to improve filling characteristics, high-frequency pulse oscillation and purging based on $N_2$ or He (at approx. 2000 to 8000 sccm) are repeated alternatively (for approx. 10 to 60 times, or 1 to 40 times in an embodiment, for example) at an interval of 0.5 millisecond to 120 seconds during the film forming process. Also, pulse oscillation and in-situ oxidation (refer to 17) explained later) are combined to improve film quality.

9) This embodiment is a method according to any one of 1) to 8) above, wherein such method is characterized in that an additional post film forming process (also referred to as post-treatment) is performed to cure the liquid reaction product on the substrate by using any one or combination of thermal reaction in a range of 100 to 1000° C. (using a gas type of $N_2$, $O_2$ or $H_2O$ and at a pressure in a range of 133 Pa to atmospheric pressure), UV light irradiation at a wavelength of 172 to 300 nm (using a gas type of $N_2$, He or $O_2$ and at a pressure in a range of 133 to 2666 Pa and UV light power in a range of 3 to 10 mW/cm$^2$) and electron beam irradiation (using a gas type of $N_2$ or He and at a pressure in a range of 133 to 2666 Pa, and electron beam power in a range of 1 to 20 keV).

10) This embodiment is a method according to 5) above, wherein such method is characterized in that the gas introduced in pre-treatment is any one or combination of $N_2$, $NH_3$, $N_2O$ and other nitrogen gases, He, Ar and other inert gases, and $O_2$, $O_3$, $H_2O$ and other oxidizing gases.

11) This embodiment is a method according to any one of 1) to 10) above, wherein such method is characterized in that when the film is cured in a liquid state immediately after it has been formed, the wafer is transferred to the heat treatment chamber by means of the vacuum handling system, if it is necessary to suppress temporal change on the surface (for example, suppressing the negative effects caused by environmental factors, such as shrinkage of film due to moisture absorption from the film surface, which may occur after film has been formed until the post film forming process is performed). In an embodiment, the post film forming process is performed in a different chamber, in which case the wafer is exposed to atmosphere while it is transferred from the film forming chamber. However, it is possible to prevent film shrinkage, etc., by performing the aforementioned pre-treatment by heat after film has been formed, without allowing the film to be exposed to atmosphere, especially when the film contains a lot of moisture or in other specific circumstances, and this provides an advantage. As for the conditions of pre-treatment by heat, it is sufficient to heat at temperatures in a range of −50 to 100° C. for approx. 30 seconds to 15 minutes, for example.

12) This embodiment is a method according to 11) above, wherein such method is characterized in that the purposes of heat treatment are to achieve curing, replace SiO, remove impurities and improve density and that this treatment is performed under conditions where the aforementioned purposes can be accomplished.

13) This embodiment is a method according to any one of 1) to 12) above, wherein such method is characterized in that any one or combination of He, Ar and other inert gases, $N_2$, $NH_3$ and other nitrogen gases, $O_2$ and other oxidizing gases, and $SiH_4$, $Si_2H_6$ and other silicon gases, is used in addition to the material gases introduced to the reaction chamber in the film forming process.

14) This embodiment is a method according to 5) above, wherein such method is characterized in that the flow rate of the gas introduced to the plasma CVD reaction chamber in the pre-treatment process is in a range of 10 to 3000 sccm.

15) This embodiment is a method according to any one of 1) to 14) above, wherein such method is characterized in that if problems are observed in the filling of a pattern having narrow strips of concave and convex areas (such as those of approx. 10 nm wide), a physical force is applied after film has been formed, but before post-treatment is performed, for the purpose of assisting the filling of such pattern having surface irregularities. By applying pressure this way, film can be pushed into concaves. As for the pressurization conditions, examples include a weight of 100 to 2000 kg, processing time of 10 to 60 minutes, and temperature of 400 to 800° C. Typically, pressurization is performed in a chamber different from the film forming chamber.

16) This embodiment is a method according to any one of 1) to 15) above, wherein such method is characterized in that a liner film constituted by SiN, SiO or Si is deposited (by a film thickness of 5 to 20 nm, for example) before the filling, for the purpose of relieving stress and improving adhesion. The method for forming such liner film is not specifically limited, and any known method can be used. It should be noted, however, that forming of liner film is not a requirement and it should be performed as deemed appropriate based on the availability/type or shape of liner film formed in the semiconductor circuit area where the foundation has surface irregularities.

7) This embodiment is a method according to any one of 1) to 16) above, wherein such method is characterized in that the surface of deposited film is protected by curing the surface after deposition, because the technology used in the film forming process deposits film in a near-liquid state and thus the film is affected by moisture when exposed to atmosphere. To be specific, for the purpose of protecting the surface condition of the formed film any one or combination of oxidization using $O_2$ or other oxidizing gas (at a flow rate of 0.1 to 1 SLM, temperature of −50 to 50° C., pressure of 133 to 800 Pa, and processing time of 10 to 600 seconds), plasma process (using a gas type of $O_2$ and at a flow rate of 0.1 to 1 SLM, temperature of −50 to 50° C., pressure of 133 to 800 Pa, RF power of 50 to 300 W, discharge distance of 18 to 30 mm, and processing time of 10 to 600 seconds; or at an $O_2$ flow rate of 0.2 to 1 SLM, He flow rate of 0.1 to 5 SLM, pressure of 133 to 800 Pa, and power output at 13.56 MHz of 20 to 500 W) and remote plasma process (using a gas type of $O_2$ and at a flow rate of 0.1 to 1 SLM, reaction chamber pressure of 133 to 800 Pa, reaction chamber temperature of −50 to 50° C., and processing time of 10 to 600 seconds) is performed inside the same reactor in succession after the forming of film. This is called "in-situ oxidization" or "in-situ post-treatment" (annealing or other post-treatment performed after film has been formed is an ex-situ post-treatment and should be differentiated from in-situ post-treatment).

According to the embodiments explained above, the total time needed to form film is typically 10 to 25 minutes per wafer. Through optimization, this time can be kept within a range of 5 to 15 minutes. In a process comprising the following five steps, the processing time of each step is as follows:
  Gas setting step: 10 to 40 seconds
  Initial film improvement step: 5 to 45 seconds
  Film forming step: 3 to 300 seconds
  In-situ post-treatment: 10 to 600 seconds
  Post-treatment: 300 to 3600 seconds In an embodiment of the present invention, it is important to adopt a material of reduced carbon content or Si material not containing carbon, where how to improve fluidity is also important. Traditionally, the discharge distance has been kept to 16 mm or less in order to generate fluidity. However, this results in filling problems in fine wiring areas such as areas where the wire width is less than 20 nm, or when STI trenches are filled. Accordingly, it is likely that the conventional method leads to high viscosity. To improve such problems, the inventors focused on the fact that fluidity can be generated by maintaining the base structure of the material to some extent. In an embodiment, fluidity is generated at a susceptor temperature in a range of −50 to 100° C., and thus it is desirable to use a liquid material of reduced or no carbon content and having a boiling point in a range of 35 to 220° C. in a liquid state (not to exceed the boiling point of the material) (examples include 1,4-disillabutane with a boiling point of 42° C. and 1,4,7-trisilanoheptane with a boiling point of 120° C.).

Also judging from the fact that breakdown by plasma is accelerated when the carbon content is reduced, the inventors examined ways to generate fluidity with ease during the deposition time of reactant gas at the process pressure. If fluidity can be controlled via selection of liquid material at the process temperature, then it is possible to expand the process margins because the limitation by the discharge distance, which is imposed under the conventional method, can be removed.

In an embodiment, film deposited by plasma CVD is not a pure silicon film immediately after deposition, and thus replacement needs to be performed by means of post-treatment for the purpose of forming a Si—O structure. The processing methods include UV light irradiation at a wavelength selected within a range of 172 to 300 nm, heat treatment using oxidizing gas, and steam treatment using $H_2O$, etc., and performing these treatments creates a finer SiO film. If the material for filling film contains a lot of carbon, as is the case under the conventional method, the film shrinkage tends to increase substantially during this post-treatment, or to be specific the film may shrink by approx. 30 to 50% based on past experience. When a reduced-carbon material or carbon-free material is used according to an embodiment of the present invention, on the other hand, the film shrinkage can be improved significantly (5 to 25%, for example) compared to the film formed under the conventional method, and the obtained film will remain in STI trenches even after the HF cleaning solution is permeated through the STI trenches. It has been confirmed that significant improvement can be obtained as a result of the above. Even when conventional carbon material methods were used, sometimes the film shrinkage was kept low and chemical resistance was demonstrated in trenches. However, these results are likely due to incomplete Si—O replacement in STI trenches and containment of carbon, etc. When carbon, nitrogen, etc., are contained, however, the leak current increases to a marked level and the dielectric constant becomes also different from that of silicon oxide film. If the film shrinkage is high in any process performed before the final process, the film becomes distorted and thus problems occur. By keeping the film shrinkage to a low level, however, not only the distortion of film can be reduced, but degassing from the film can also be reduced in the final process, which is another advantage.

In an embodiment of the present invention, the material contains a reduced level of carbon or no carbon at all, which is advantageous in that the problem of residual carbon in STI trenches can also be prevented.

Depending on the conditions, the film becomes weak immediately after the start of plasma oscillation when reaction product is deposited by plasma. Accordingly, the initial film improvement step is sometimes used before the film forming step in the process recipe. An unstable condition occurs depending on the amount of plasma applied during plasma ignition and the flow rate of material, and film quality drops as a result. The initial film improvement step can be applied regardless of the film forming condition or film type. Inserting the initial film improvement step has the effect of reducing the damage caused by chemical solution applied to the filling film that has been deposited over the semiconductor circuit pattern having surface irregularities, and effects of improvement have been confirmed at the bottom of trenches in areas of surface irregularities. To be specific, low pressure and high flow rate of inert gas are used as parameters for improving film quality, and plasma oscillation is performed under these parameter conditions, after which the various settings of the applicable gas type are changed to the filling conditions. It has been confirmed that by adopting this recipe, plasma oscillation becomes possible in a range where the RF power is low, along with the effects of expanding the process condition margins. Plasma is not easily generated when the RF output is low, or specifically at 50 W or less. When plasma is applied at high output (output exceeding 50 W) and then the output is set to 50 W or less subsequently (such as 5 to 30 seconds later), on the other hand, plasma can be generated even at such low output.

Figure 8:
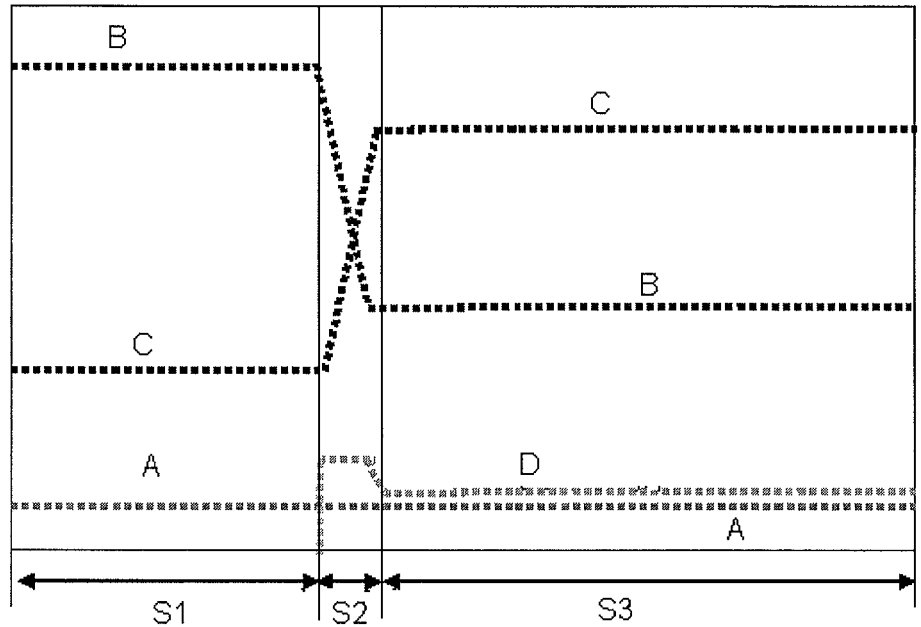
FIG. 8 is a schematic chart illustrating a process recipe according to an embodiment of the present invention. The chart is for showing changes and relative values, and the vertical and horizontal axes have arbitrary unit values.
Figure 9:
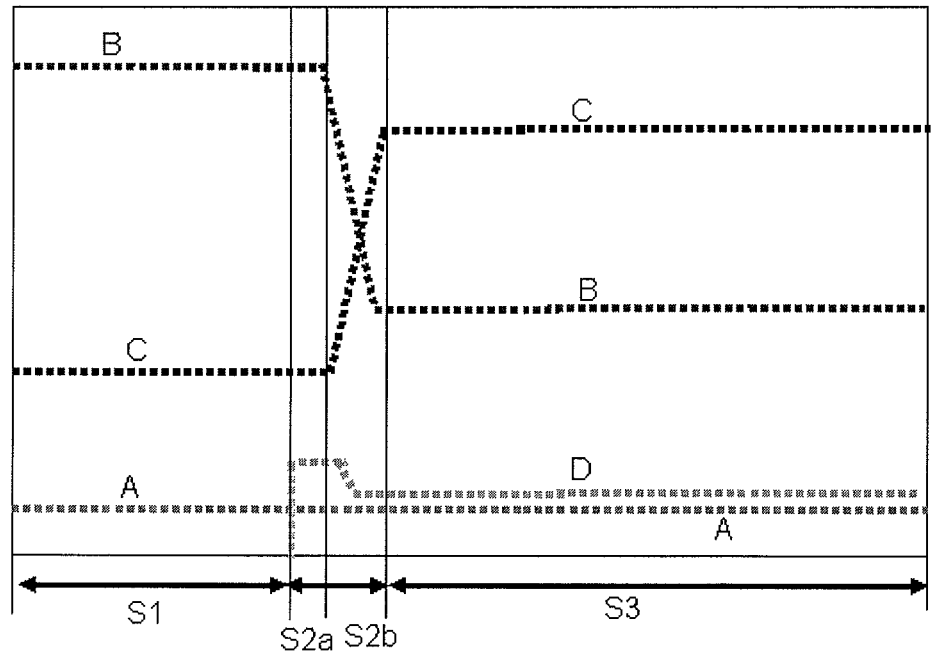
FIG. 9 is a schematic chart illustrating a process recipe according to another embodiment of the present invention. The chart is for showing changes and relative values, and the vertical and horizontal axes have arbitrary unit values.
Figure 10:
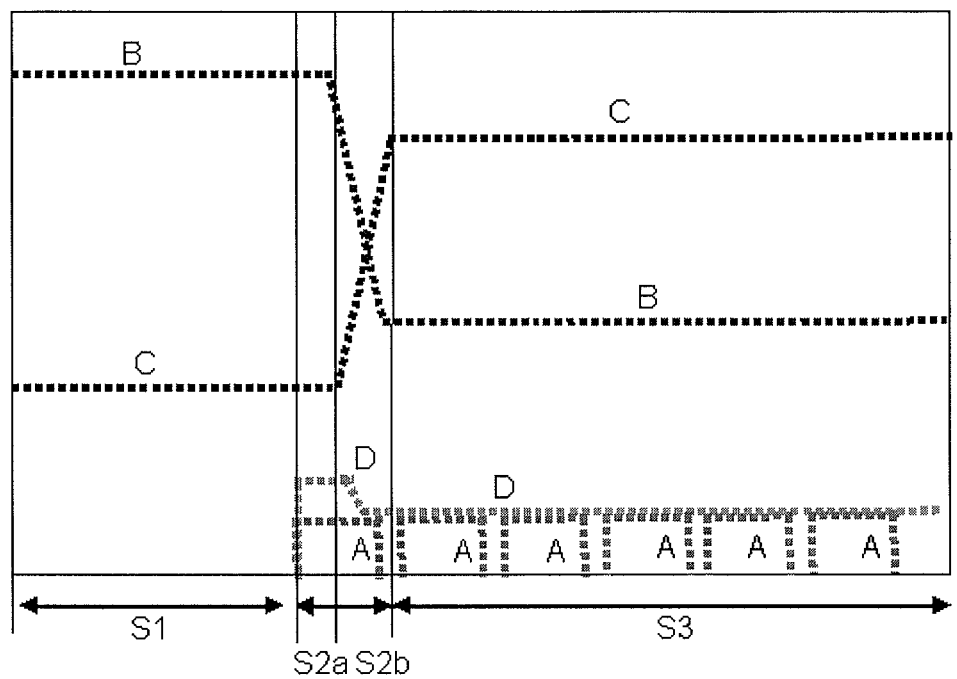
FIG. 10 is a schematic chart illustrating a process recipe according to still another embodiment of the present invention. The chart is for showing changes and relative values, and the vertical and horizontal axes have arbitrary unit values.

Also, depending on the situation it is possible to improve filling performance further and stabilize plasma discharge by varying the material flow rate. For example, three types of recipes are shown in FIGS. 8, 9 and 10. It should be noted that these recipes are only examples.

All of recipe 1 (FIG. 8), recipe 2 (FIG. 9) and recipe 3 (FIG. 10) comprise gas setting step S1, initial film improvement step S2 and film forming step S3. Since the general conditions in each step were already explained earlier, only the differences from the aforementioned conditions are indicated here. In-situ pre-treatment, in-situ oxidization and post-treatment are not illustrated. In gas setting step S1, RF application D is not performed, and in recipes 1 (FIG. 8) and 2 (FIG. 9) material A and inert gas B are introduced at constant flow rates. In recipe 3 (FIG. 10), material A is not introduced. Inert gas flow rate B is relatively high, while pressure C is relatively low. In film forming step S3, inert gas flow rate B is constant and lower than in gas setting step S1. Pressure C rises from the level in gas setting step S1 and becomes constant. In an embodiment, pressure change is 20 to 60%, while the flow rate of inert gas changes by 20 to 60% in an embodiment. Initial film improvement step S2 is a transitional stage where RF application D is started.

In recipes 2 (FIG. 9) and 3 (FIG. 10), changes in inert gas flow rate B and pressure C occur not simultaneously as the start of RF application D, but after a slight delay, and in this sense these two recipes are different from recipe 1 (FIG. 8). To be specific, initial film improvement step S2 is divided into the step covering the section after RF is started until inert gas flow rate B and pressure C start to change (S2a) and the step covering the section where inert gas flow rate B and pressure C are changing (S2b). In recipe 2, the condition of plasma polymerization varies due to this segmentation of initial film improvement step S2, which results in a smaller filling amount due to the initial reaction as a result of RF application. This is likely the reason why voids can be prevented easily.

Also in the initial film improvement step, power exceeding 50 W is applied when RF application is started, if the power of RF application D is 50 W or less in film forming step S3. This is because, while plasma does not generate easily if the output is 50 W or less, when plasma is applied at high output (output exceeding 50 W) and then the output is set to 50 W or less subsequently (such as 5 to 30 seconds later), plasma can be generated even at such low output.

In film forming step S3 under recipe 3 (FIG. 10), material gas A is introduced in pulses. Pulsed introduction of material gas A further improves the filling characteristics, and in particular the film shrinkage can be lowered markedly in the post-treatment of the obtained filling film. In an embodiment, the film shrinkage is 10% or less.

The durations of steps are approx. 10 to 40 seconds for S1, 5 to 30 seconds for S2 and 3 to 300 seconds for S3 under recipe 1 (FIG. 8), and approx. 10 to 40 seconds for S1, 5 to 15 seconds for S2a, 5 to 30 seconds for S2b and 3 to 300 seconds for S3 under recipes 2 (FIG. 9) and 3 (FIG. 10). Pulsed introduction of material gas A in recipe 3 (FIG. 10) is implemented by repeating an introduction cycle of 5 to 60 seconds at an interval of 5 to 60 seconds, for example. In addition to using recipe 3, the same effect as pulsing can also be achieved by alternating the ON and OFF of RF application while keeping the introduction rate of material gas constant. Here, it is sufficient that the cycle is equivalent to the material gas cycle.

Also, sometimes impurities are produced as hydrocarbon byproduct as a result of oxidization during post-treatment. In this case, these impurities are accumulated at the bottom of the film, and accordingly the inventors examined a possible countermeasure of forming film in multiple stages by separating the film forming process and annealing process, instead of using a single filling stage. It has been confirmed that the film quality improves if post-treatment is implemented without fail after film has been formed in order to oxidize the film deposited through each step and also to remove impurities by means of heat.

An apparatus that can be used in an embodiment of the present invention is explained below.

Figure 4:
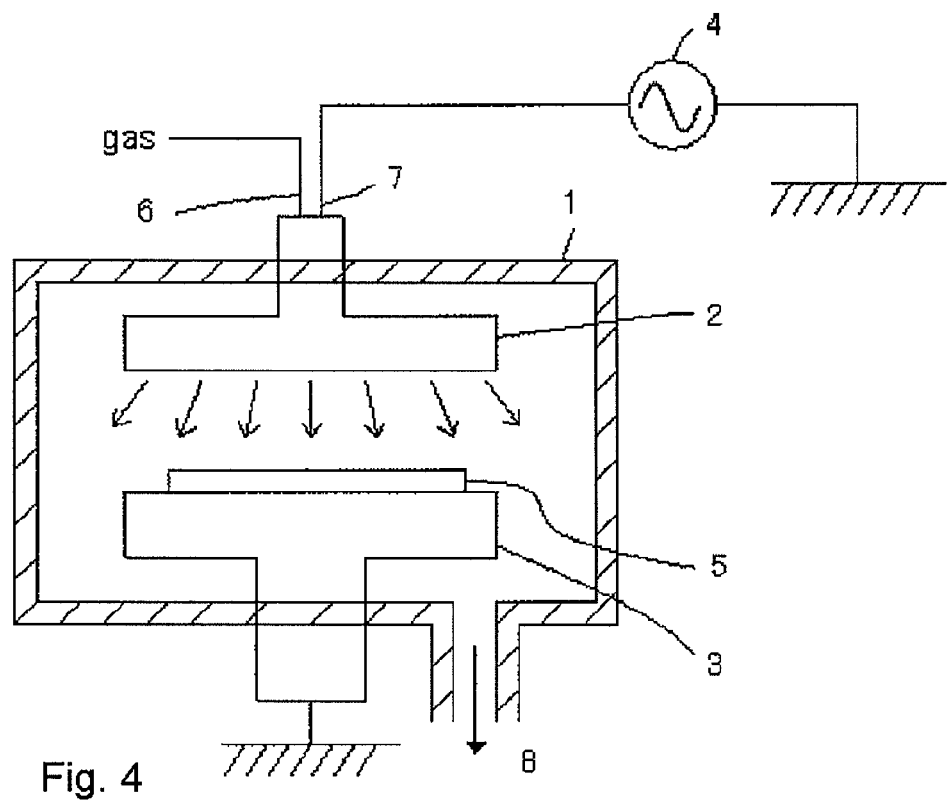
FIG. 4 is a schematic view illustrating a plasma CVD apparatus usable in an embodiment of the present invention.

FIG. 4 shows a plasma CVD apparatus usable in an embodiment of this invention. The plasma CVD device includes reaction chamber 1, a gas inlet port 6, a susceptor 3 (serving as a lower electrode) provided with an embedded temperature controller which can be a coil in which a coolant or heating medium flows in a channel to control the temperature of the susceptor 3 and an overlying semiconductor substrate 5. A showerhead 2 (serving as an upper electrode) may be disposed immediately under the gas inlet port. The showerhead 2 has a number of fine openings at its bottom face and can inject reaction gas to the semiconductor substrate 5 therefrom. There is an exhaust port 8 at the bottom of the reaction chamber 1. This exhaust port 8 is connected to an outer vacuum pump (not shown) so that the inside of the reaction chamber 1 can be evacuated. The susceptor 3 is placed in parallel with and facing the showerhead 2. The susceptor 3 holds the semiconductor substrate 5 thereon and heats or cools it with the temperature controller. The gas inlet port 6 is insulated from the reaction chamber 1 and connected to an outer high frequency power supply 4. Alternatively, the susceptor 3 can be connected to the power supply 4. Thus, the showerhead 2 and the susceptor 3 can each act as a high frequency electrode and generate a plasma reacting field in proximity to the surface of the semiconductor substrate 5.

The gases can be mixed upstream of the gas inlet port 6 to constitute a process gas, or each or some of the gases can be introduced separately into the showerhead 2. The space between the showerhead 2 and the semiconductor substrate 5, both located inside of the reaction chamber 1 which is already evacuated, is charged with RF power which has a single frequency or mixed frequencies (e.g., 13.56 MHz to 60 MHz), and the space serves as a plasma field. The susceptor 3 continuously heats or cools the semiconductor substrate 5 with the temperature controller and maintains the substrate 5 at a predetermined temperature that is desirably −50° C.-50° C. The process gas supplied through the fine openings of the showerhead 2 remains in the plasma field in proximity to the surface of the semiconductor substrate 5 for a predetermined time.

When the insulation film is deposited on the substrate, the gas inside the reaction chamber is discharged through the exhaust port 8 and replaced with a reduction gas or a mixture of a reduction gas and an inert gas, while maintaining the substrate in the reaction chamber.

The temperature of the susceptor 3 can be controlled by means of a heater and/or cooling conduits (now shown). This cooling susceptor may be made of ceramics and is provided with the cooling conduits at a lower portion of a metal plate and a shaft portion so that a cooling medium such as water can circulate.

Figure 5:
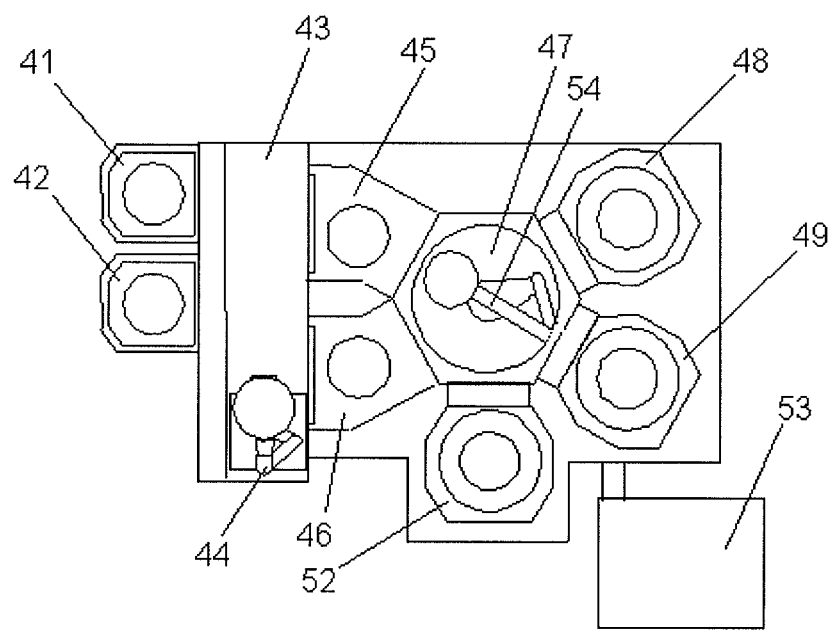
FIG. 5 is a schematic plane view illustrating a cluster type plasma CVD apparatus usable in an embodiment of the present invention.

The reaction chamber 1 can be provided as a module installed in a cluster type apparatus as shown in FIG. 5. The reaction chambers 48, 49, and 52 are connected to a wafer handling chamber 47 in which a vacuum handling robot 54 is provided. An unprocessed wafer in a wafer cassette 41, 42 is taken out by an atmospheric handling robot 44 in a minienvironment 43 to a load lock chamber 45, 46 which is connected to the wafer handling chamber 47. The temperature of susceptors in the reaction chambers 48, 49, 52 can be cooled using a cooling system 53 which circulates a cooling medium through cooling conduits provided in each susceptor. A processed wafer is transferred from the reaction chamber 48, 49, 52 to the wafer cassette 41, 42 through the load lock chamber 45, 46. The reaction chamber 52, for example, can be designated as a thermal treatment chamber, and after a film is deposited on a wafer in the reaction chamber 48, 49, the wafer is transferred to the thermal treatment chamber 52 through the wafer handling chamber (i.e., without being exposed to the external atmosphere) for preliminary thermal treatment so as to temporarily inhibit shrinkage of the film until the film is subjected to a post deposition treatment which can be conducted in another chamber. If the film contains relatively high moisture, shrinkage of the film may occur while the wafer is transferred from the reaction chamber to the post deposition treatment chamber through the external atmosphere. The preliminary thermal treatment may be effective in inhibiting the shrinkage of the film until the post deposition treatment.

Figure 6:
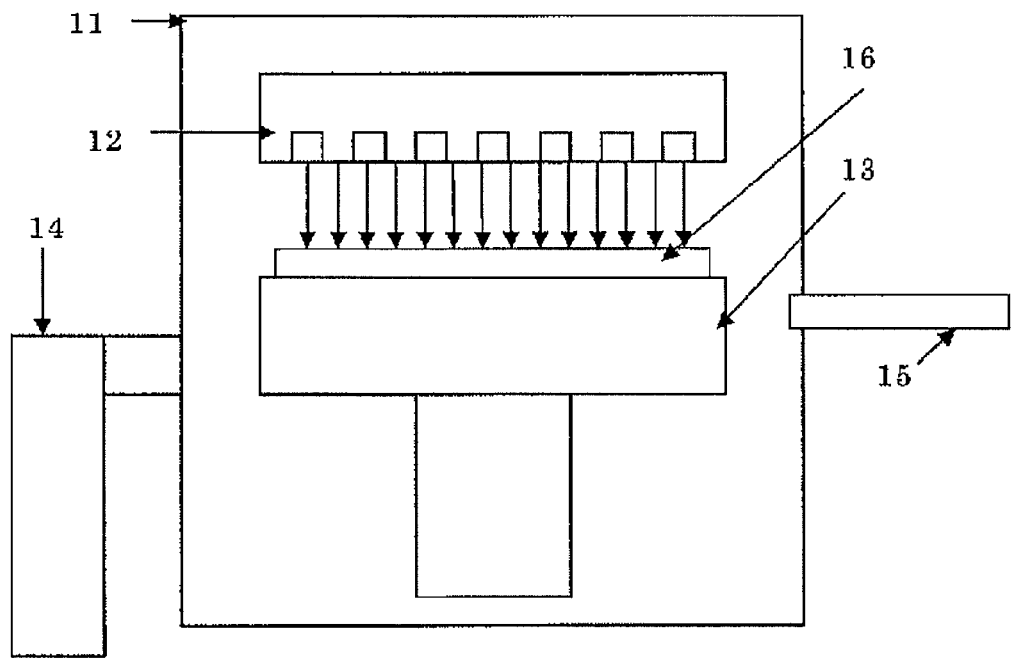
FIG. 6 is a schematic view illustrating a UV curing apparatus usable in an embodiment of the present invention.

In an embodiment, subsequently, a curing process is performed on the semiconductor substrate taken out from the reactor using the UV cure apparatus shown in FIG. 6. The UV cure apparatus comprises a process chamber 11, a UV lamp 12, a susceptor 13, an exhaust port 14, and a gas inlet port 15. The UV lamp 12 and the susceptor 13 are disposed parallel to each other, and are heated by heaters embedded in each of them, respectively. The semiconductor substrate 16, which is a workpiece, is placed on the susceptor 13 and is heated and held. Projected from the UV lamp 12, light having a wavelength selected from the range of 172 to 250 nm is irradiated toward the semiconductor substrate 16. When the semiconductor substrate is irradiated with this light, gases such as He, $H_2$, $N_2$, $O_2$, $CO_2$, etc. (depending on the intended type of film) are introduced through the gas inlet port 15 simultaneously with the irradiation. As pores are formed in the film, with H, O, C, etc. being desorbed from a low-dielectric-constant structure, the number of unstable bonds in the structure are reduced; hence, a film having a lower dielectric constant and higher strength can be obtained.

As the UV cure apparatus, the apparatus disclosed in U.S. Patent Publication No. 2006-0165904 can be used in an embodiment, the disclosure of which is incorporated herein by reference in its entirety with regard to the UV cure apparatus.

Figure 7:
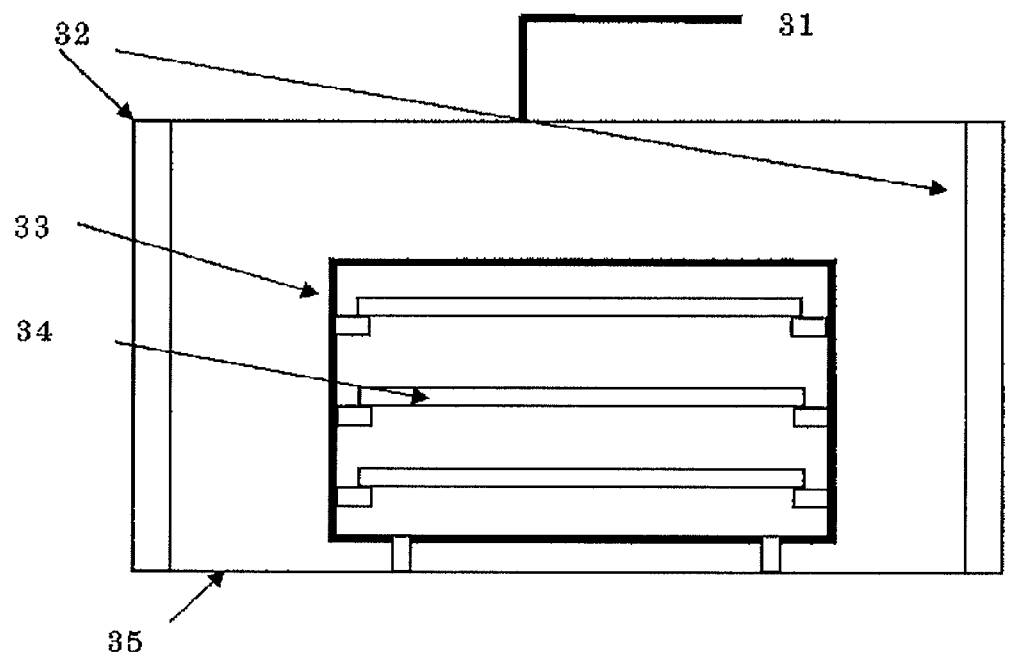
FIG. 7 is a schematic view illustrating a thermal annealing apparatus usable in an embodiment of the present invention.

The heat-treating step can be performed by thermal annealing in place of the UV curing. FIG. 7 shows a schematic diagram of a thermal annealing apparatus. In a chamber 35, a quartz boat 33 is provided, and a substrate 34 is placed inside the quartz boat 33. The temperature inside the quartz boat 33 is controlled by a heater 32, and gases can be introduced inside through a gas inlet port 31.

The skilled artisan will appreciate that the apparatus includes one or more controller(s) (not shown) programmed or otherwise configured to cause the deposition and reactor cleaning processes described elsewhere herein to be conducted. The controller(s) communicate with the various power sources, heating systems, pumps, robotics and gas flow controllers or valves of the reactor, as will be appreciated by the skilled artisan.

In the present disclosure where conditions and/or structures are not specified, the skilled artisan in the art can readily provide such conditions and/or structures, in view of the present disclosure, as a matter of routine experimentation.

EXAMPLE

Experiments were conducted as described below. The results are indicated in tables below. In the tables, a downward pointing arrow indicates that the immediately overlying entry is carried over to the box containing the arrow. In these experiments, a plasma CVD apparatus (Eagle® 12, ASM Japan) shown in FIG. 4 was used.

An insulation film was formed on and filled in an irregular surface of SiN formed on a Si wafer (300 mm), the surface including a trench having a width of 20-500 nm (a depth of about 100-500 nm). UV treatment was conducted in the UV treatment apparatus shown in FIG. 5. Thermal treatment was conducted in the batch-type furnace chamber shown in FIG. 6. A wet etch evaluation was conducted as follows: After a film was deposited on a substrate and subjected to post deposition treatment, a trench filled with the film was vertically cut to show a vertical cross section of the trench and then submerged in an undiluted liquid of LAL500 (manufactured by Stella-Chemifa in Japan). The vertical cross section was exposed to the liquid under conditions such that a thermally oxidized film is etched by 5 to 20 nm. A structurally weaker portion is etched more than a relatively firm portion.

The thermally oxidized film used as a control was obtained by treating a film at 900° C. or higher in an oxygen or water vapor atmosphere.

In the tables, the "etching ratio" means a ratio of the etching rate of a film tested to the etching rate of a thermally oxidized film in conditions where the thermally oxidized film is etched by 5 to 20 nm.

Parameter Experiment

Basic evaluation was conducted using 1,4-disilabutane ($Si_2C_2H_{10}$) whose carbon content was reduced from the levels in conventional organic materials. Since this material had a boiling point of 41° C., the susceptor temperature was set to 0° C. Filling condition was checked by setting the flow rate of liquid material to 20 sccm, RF power output at 13.56 MHz to 30 W, flow rate of additive He to 2 SLM and discharge distance to 20 mm, as a base, with the process pressure varied in a range of 133 to 1333 Pa. Filling shape was checked using a pattern of STI trenches that were 20 to 500 nm wide.

As a result, filling effect could be achieved but fluidity tended to drop in a pressure range of 133 to 400 Pa. If fluidity was high, all liquid reaction product entered the trenches, without remaining at the top of the pattern, when an attempt was made to fill trenches by only around half. In a pressure range of 133 to 400 Pa, trenches could be filled but liquid reaction product remained at the top of the pattern.

It was confirmed that STI trenches could be filled reliably when the pressure range was adjusted to 450 to 933 Pa. When the pressure was 1333 Pa or above, plasma decomposition reaction was promoted and Si powder deposited. Based on the above, it was confirmed that fluidity would be generated in a specific pressure range. However, it is considered that this pressure range is likely dependent on the selected liquid Si material and other additive materials.

By the way, the pressure at which fluidity generates could be adjusted to 266 Pa or above by setting the susceptor temperature to 0° C. or below (such as −20° C.), while it could be adjusted to 133 Pa or above by lowering the susceptor temperature further (to near −50° C.). Probably this has to do with the relationship of susceptor temperature and pressure. The trend also varied according to the boiling point of material. Therefore, it can be concluded that the process conditions are dependent on the material and susceptor temperature settings.

Similar evaluation was performed by varying the pressure within a range of 133 to 1333 Pa, with the RF power output raised to up to 200 W. The results found that the step coverage performance was low and Si powder deposited. When the RF power output was 200 W or more, reaction was promoted substantially and thus the material remained in a state of bulk or powder or mixture thereof, instead of in a liquid state, and the shape became extremely disadvantageous in terms of coverage performance and powder was found on the surface.

Based on the above results, it was confirmed that deposits on the substrate could be controlled by maintaining the structure of liquid material in the form of controlling the RF power output at a low level, while at the same time controlling the gas dwell time in the reactor (because filling at high pressure becomes possible, the pressure control valve is closed further and the gas dwell time in the reactor increases). It is also considered that fluidity can be improved further by changing the susceptor temperature.

Examples 1 to 20

Film was filled under the conditions shown in Table 1. Recipe 1 in the table corresponds to the recipe shown in FIG. 8, recipe 2 corresponds to the recipe shown in FIG. 9 and recipe 3 corresponds to the recipe shown in FIG. 10. Under each recipe, the He flow rate in the gas setting step was 4 SLM and pressure was 533 Pa. In the initial film improvement step, the power output at the start of RF application was 50 W, which was then lowered to 30 W. The durations of respective steps were as follows: 20 seconds for the gas setting step (S1), 10 seconds for the initial film improvement step (S2) and 60 seconds for the film forming step (S3) under recipe 1; and 20 seconds for the gas setting step (S1), 10 seconds for the first period of the initial film improvement step (S2a), 10 seconds for the second period of the initial film improvement step (S2b) and 60 seconds for the film forming step (S3) under recipes 2 and 3. By the way, under recipe 3 the pulsing of material gas was repeated in cycles of 10 seconds of supply and 10 seconds of stopping.

In each example, in-situ oxidization was performed after the film forming step. The conditions were as follows: $O_2$ flow rate of 1 SLM, He flow rate of 0.2 SLM, pressure of 266.6 Pa, RF power output at 13.56 MHz of 100 W, and processing time of 60 seconds.

Also, pre-treatment ($O_2$ plasma treatment at an $O_2$ flow rate of 1 SLM, pressure of 266.6 Pa, RF power output at 13.56 MHz of 300 W, processing time of 60 seconds, and temperature of 0° C.) was performed in the film forming step under all of recipes 1, 2 and 3. (This pre-treatment is not illustrated in FIGS. 8 to 10.)

Furthermore in the table, "Once" in the "Film forming" field indicates that trenches were filled by a sequence of in-situ pre-treatment, film forming and in-situ oxidization, while "Twice" indicates that trenches were filled by a sequence of in-situ pre-treatment, film forming, in-situ pre-treatment, film forming and in-situ oxidization.

The post-treatment conditions are shown in Table 2. In Examples 9 to 12, the letter in parentheses in the "Post-treatment" field indicates alternative processing conditions.

Figure 1B:
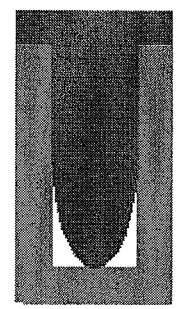
Figure 1C:
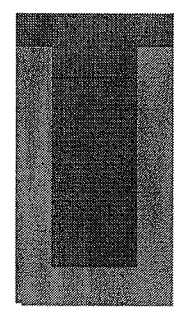

The results are shown in Table 3. In Table 3, "A" in the "Condition of cross-section after exposure to chemical solution" field refers to the condition shown in FIG. 1A, "B" refers to the condition shown in FIG. 1B, and "C" refers to the condition shown in FIG. 1C. In condition A, film was removed from trenches due to chemical solution, and voids 102 generated at the bottom of trenches 101 up to near the center after parts of film 100 embedded in the trenches had been removed, as shown in FIG. 1A. Removed areas represent weak areas of film. In condition B, parts of film at the bottom of trenches were removed due to chemical solution and voids generated, as shown in FIG. 1B. In condition C, film was not removed in trenches due to chemical solution, as shown in FIG. 1C.

TABLE 1

| Example | Material name | Flow rate of material (sccm) | Additive material | Flow rate of additive material (sccm) | Flow rate of He (SLM) | Pressure (Pa) | RF power output at 13.56 MHz (W) | Discharge distance (mm) | Recipe | Film forming | Post-treatment |
|---|---|---|---|---|---|---|---|---|---|---|---|
| 1 | 1,4-disilabutane | 40 | None | 0 | 3 | 800 | 30 | 20 | 1 | Once | A |
| 2 | ↓ | ↓ | ↓ | ↓ | ↓ | ↓ | ↓ | ↓ | ↓ | ↓ | B |
| 3 | ↓ | ↓ | ↓ | ↓ | ↓ | ↓ | ↓ | ↓ | ↓ | ↓ | C |
| 4 | ↓ | ↓ | ↓ | ↓ | ↓ | ↓ | ↓ | ↓ | ↓ | ↓ | D |
| 5 | ↓ | ↓ | ↓ | ↓ | ↓ | ↓ | ↓ | ↓ | 2 | ↓ | A |
| 6 | ↓ | ↓ | ↓ | ↓ | ↓ | ↓ | ↓ | ↓ | ↓ | ↓ | B |
| 7 | ↓ | ↓ | ↓ | ↓ | ↓ | ↓ | ↓ | ↓ | ↓ | ↓ | C |
| 8 | ↓ | ↓ | ↓ | ↓ | ↓ | ↓ | ↓ | ↓ | ↓ | ↓ | D |
| 9 | ↓ | ↓ | ↓ | ↓ | ↓ | ↓ | ↓ | ↓ | 1 | Twice | A(E) |
| 10 | ↓ | ↓ | ↓ | ↓ | ↓ | ↓ | ↓ | ↓ | ↓ | ↓ | B(E) |
| 11 | ↓ | ↓ | ↓ | ↓ | ↓ | ↓ | ↓ | ↓ | ↓ | ↓ | C(E) |
| 12 | ↓ | ↓ | ↓ | ↓ | ↓ | ↓ | ↓ | ↓ | ↓ | ↓ | D(E) |
| 13 | ↓ | 20 | ↓ | ↓ | 2 | ↓ | ↓ | ↓ | ↓ | Once | B |
| 14 | ↓ | ↓ | ↓ | ↓ | ↓ | ↓ | ↓ | ↓ | 2 | ↓ | ↓ |
| 15 | ↓ | ↓ | 1,1,3,3TMDS | 20 | ↓ | ↓ | ↓ | ↓ | ↓ | Twice | ↓ |
| 16 | ↓ | 40 | None | 0 | 3 | ↓ | ↓ | ↓ | 3 | Once | C |
| 17 | ↓ | ↓ | ↓ | ↓ | ↓ | ↓ | ↓ | ↓ | ↓ | ↓ | D |
| 18 | 1,1,3TMDS | ↓ | SiH4 | 30 | ↓ | 266 | ↓ | ↓ | 1 | ↓ | B |
| 19 | ↓ | ↓ | ↓ | ↓ | ↓ | ↓ | ↓ | ↓ | ↓ | ↓ | D |
| 20 | ↓ | 25 | ↓ | ↓ | 1 | ↓ | 100 | ↓ | ↓ | ↓ | C |

1,1,3,3TMDS(1,1,3,3-tetramethyldisilazane)

TABLE 2

| Post-treatment | Primary treatment Method | Temperature (°C.) | Secondary treatment Method | Temperature (°C.) | Tertiary treatment Method | Temperature (°C.) |
|---|---|---|---|---|---|---|
| A | Heat treatment in $N_2$ atmosphere<br>$N_2$ flow rate: 1 SLM<br>Pressure: Atmospheric pressure<br>Processing time: 1 hour | 400 | Heat treatment in $N_2$ atmopshere<br>$N_2$ flow rate: 1 SLM<br>Pressure: Atmospheric pressure<br>Teatment time: 60 minutes | 800 | — | — |
| B | UV treatment in $O_2$ atmosphere<br>Light source: 172-nm Xe lamp<br>Output: 3 to 10 mW/cm$^2$<br>Processing time: 10 minutes | 100 | Heat treatment in $N_2$ atmopshere<br>$N_2$ flow rate: 1 SLM<br>Pressure: Atmospheric pressure<br>Teatment time: 60 minutes | 400 | Heat treatment in $N_2$ atmopshere<br>$N_2$ flow rate: 1 SLM<br>Pressure: Atmospheric pressure<br>Teatment time: 60 minutes | 800 |
| C | UV treatment in $O_2$ atmosphere<br>Light source: 172-nm Xe lamp<br>Output: 3 to 10 mW/cm$^2$<br>Processing time: 10 minutes | 400 | Heat treatment in $N_2$ atmopshere<br>$N_2$ flow rate: 1 SLM<br>Pressure: Atmospheric pressure<br>Teatment time: 60 minutes | 400 | Heat treatment in $N_2$ atmopshere<br>$N_2$ flow rate: 1 SLM<br>Pressure: Atmospheric pressure<br>Teatment time: 60 minutes | 800 |
| D | Heat treatment using $H_2O/O_2$<br>$H_2O$ flow rate: 5 g/min<br>Pressure: Atmospheric pressure<br>Processing time: 1 hour | 400 | Heat treatment in $N_2$ atmopshere<br>$N_2$ flow rate: 1 SLM<br>Pressure: Atmospheric pressure<br>Teatment time: 60 minutes | 400 | Heat treatment in $N_2$ atmopshere<br>$N_2$ flow rate: 1 SLM<br>Pressure: Atmospheric pressure<br>Teatment time: 60 minutes | 800 |
| E | Heat treatment in $N_2$ atmopshere<br>$N_2$ flow rate: 1 SLM<br>Pressure: Atmospheric pressure<br>Teatment time: 60 minutes | 800 | — | — | — | — |

TABLE 3

| Example | Filling performance | Film shrinkage (%) | RI | Ratio to thermal oxidization film | Condition of cross-section after exposed to chemical solution | Remarks |
|---|---|---|---|---|---|---|
| 1 | Completely filled. | 20 | 1.43 | 1.1 times | A | Insufficient post-curing |
| 2 | ↓ | 16 | ↓ | 1.2 times | B | ↓ |
| 3 | ↓ | 15 | ↓ | 1.2 times | C | Improvement was seen even with only one film forming step, due to post-treatment. |
| 4 | ↓ | 18 | ↓ | 1.3 times | C | ↓ |
| 5 | ↓ | 19 | 1.44 | 1.2 times | C | Film quality in trenches was good due to the recipe. |
| 6 | ↓ | 17 | ↓ | 1.3 times | C | ↓ |
| 7 | ↓ | 15 | ↓ | 1.3 times | C | ↓ |
| 8 | ↓ | 16 | ↓ | 1.3 times | C | ↓ |
| 9 | ↓ | 20 | ↓ | 1.1 times | C | Film quality in trenches was good due to multiple film forming stages. |
| 10 | ↓ | 21 | ↓ | 1.2 times | C | ↓ |
| 11 | ↓ | 19 | ↓ | 1.2 times | C | ↓ |
| 12 | ↓ | 17 | ↓ | 1.2 times | C | ↓ |
| 13 | Voids generated in trenches. | 14 | 1.435 | 1.1 times | A | Voids generated in the film forming step. |
| 14 | Completely filled. | 16 | 1.44 | 1.3 times | B | Voids could be avoided due to the recipe. |
| 15 | ↓ | 28 | 1.43 | 2 times | C | Film quality in trenches was good. |
| 16 | ↓ | 8 | 1.44 | 1.2 times | C | Good filling performance was achieved due to pulsing of material. |
| 17 | ↓ | 6 | ↓ | 1.1 times | C | ↓ |
| 18 | ↓ | 25 | 1.42 | 3 times | A | Insufficient post-curing |
| 19 | ↓ | 26 | 1.42 | 2.9 times | A | ↓ |
| 20 | ↓ | 40 | 1.41 | 3 times | A | Worse than A. No film in trenches. |

In Example 1, only one film improvement step and only one film forming step were performed, and tertiary treatment was not performed as part of post-treatment (A). As a result, post-curing was insufficient and film was removed in trenches after exposure to chemical solution (or voids generated in the film forming stage). In Example 2, the low temperature of primary treatment as part of post-treatment resulted in insufficient post-curing and film was removed in trenches after exposure to chemical solution, just like in Example 1. In Examples 3 and 4, sufficient post-treatment was performed and therefore good filling characteristics were achieved, film was not removed after exposure to chemical solution, and film of good quality was achieved in trenches, although only one film forming step was implemented as in Examples 1 and 2.

Examples 5 to 8 were conducted under conditions corresponding to Examples 1 to 4, respectively, but two film improvement steps were performed in the former group of examples. Because of the two film improvement steps, film of good quality was achieved in trenches in Examples 5 and 6 that were conducted under conditions corresponding to Examples 1 and 2.

In Examples 9 to 12, only one film improvement step was performed in the same manner as in Examples 1 to 4, but in these examples two film forming steps were performed. Because of the two film forming steps, film of good quality was achieved in trenches in Examples 9 and 10 that were conducted under conditions corresponding to Examples 1 and 2. The same result was obtained in Examples 9 to 12 where post-treatment comprising only primary treatment (E) at high temperature.

Example 13 was conducted under conditions corresponding to Example 2, but the flow rate of material gas was reduced to 20 sccm and He flow rate was also reduced to 2 SLM to form film. As a result, film was removed in trenches after exposure to chemical solution more than in Example 2, and it seems voids also generated while film was being formed. In Example 14, which was conducted under conditions corresponding to Example 13, two film improvement steps (recipe 2) were adopted. As a result, removal of film after exposure to chemical solution was less than in Example 13. In Example 15, two film forming steps were performed, as well, and 1,1,3,3-TMDS was added as an additive material. Because of the two film forming steps, film quality in trenches improved further and film was not removed after exposure to chemical solution. However, the ratio to thermal oxidation film (etch rate) was high, or twice, and the film was weaker than in other examples. The film shrinkage was also high, or 28%. These are likely due to addition of 1,1,3,3-TMDS, which could have increased the carbon content during the film forming process and thereby caused Si and other contents to be lost, as well, when carbon was removed during replacement/oxidation.

Examples 16 and 17 correspond to Examples 3 and 4 and Examples 7 and 8. The difference is that, while Examples 3 and 4 used recipe 1, and Examples 7 and 8 used recipe 2, Examples 16 and 17 used recipe 3 (pulsed material supply). As a result, the film shrinkage decreased significantly compared to when recipes 1 and 2 were used, to less than 10%.

On the other hand, Examples 18 and 19 correspond to Examples 2 and 4, except that 1,1,3,3-TMDS was used as a material gas and $SiH_4$ was used as an additive gas. It turned out, however, that Examples 18 and 19 resulted in lower chemical resistance and higher film shrinkage, which exceeded 20%. Also in Example 20, where the flow rates of material gas and additive gas were lowered than in Examples 18 and 19 (post-treatment: C), chemical resistance dropped further and the film shrinkage became as much as 40%.

Examples 1 to 14, 16 and 17 all produced favorable results in terms of film shrinkage, which was roughly at or below 20%. In particular, the film shrinkage was less than 10% in Examples 16 and 17.

Removal of Impurities by Post-Treatment

Figure 2:
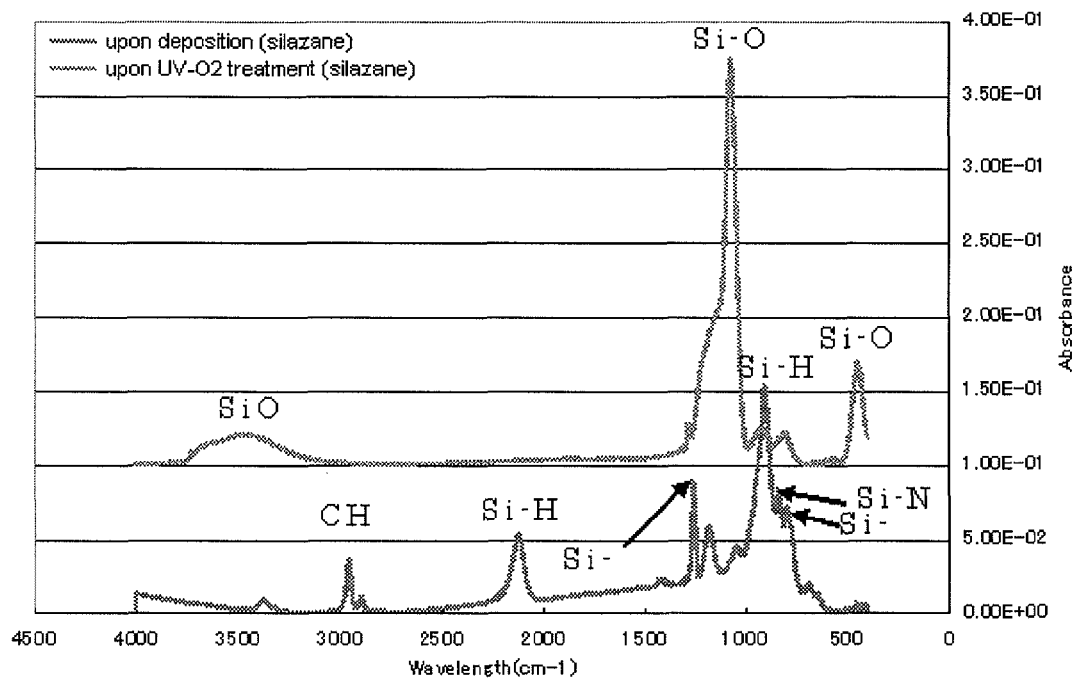
FIG. 2 is an FT-IR chart of a film formed of 1,1,3,3-tetramethylsilazane before and after a post deposition treatment.
Figure 3:
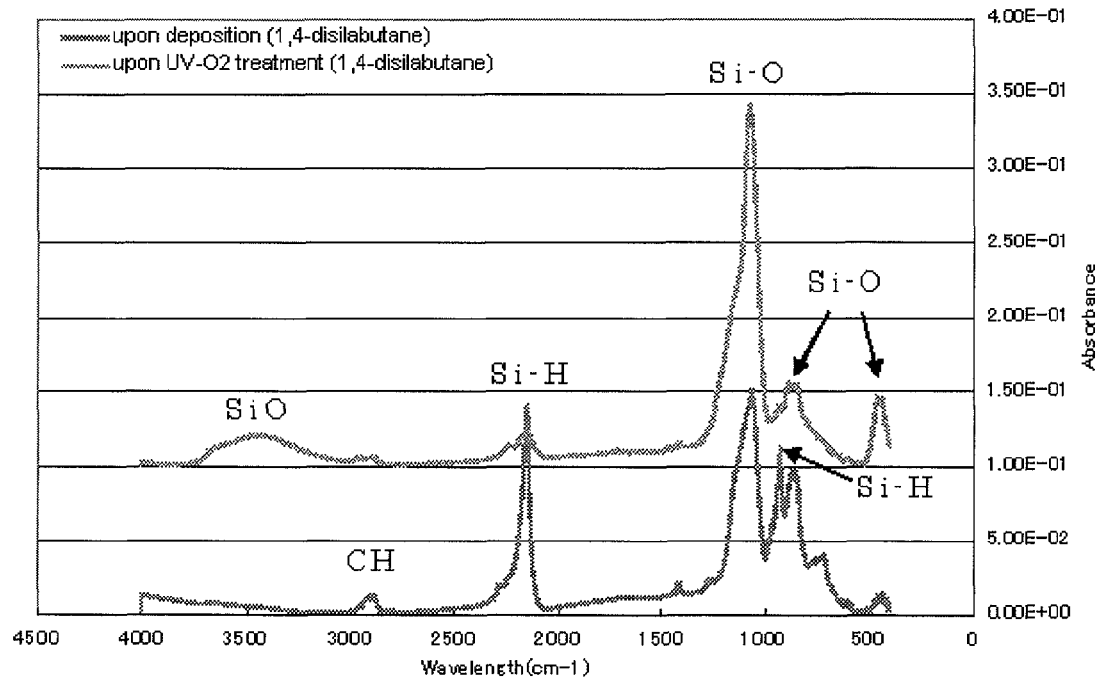
FIG. 3 is an FT-IR chart of a film formed of 1,4-disilabutane before and after a post deposition treatment.

The FT-IR results shown in FIG. 2 (Example 20) and FIG. 3 (Example 3) reflect measurements taken after deposition of film on a silicon substrate and after UV irradiation using a Xe lamp on the assumption of one filling process. As you can see, there is a notable difference in carbon bond between conventional silazane material (1,1,3,3-tetramethylsilazane formed by adjusting the flow rate of 1,1,3,3-tertamethyl to 30 sccm, $SiH_4$ flow rate to 25 sccm, $NH_3$ flow rate to 50 sccm, pressure to 266 Pa, discharge distance to 20 mm and He flow rate to 2 SLM) (FIG. 2) and 1,4-disilabutane conforming to an embodiment of the present invention (Example 3 mentioned earlier) (FIG. 3). With 1,4-disilabutane material, the rate of shrinkage of film thickness was 10 to 20% even after post-treatment, while the shrinkage tended to increase with conventional silazane material. Silazane material exhibited a large intensity peak of Si—$CH_3$, suggesting high dependence on Si—O replacement during post-treatment. When $CH_3$ is removed from the Si—$CH_3$ bond and also in the breakdown process, $CH_3OH$, SiOH, etc., are produced as byproduct. These substances have low boiling points and have been confirmed to cause evaporation loss easily. The film composition of silazane is SiONCH, which indicates greater nitrogen content compared to 1,4-disilabutane film whose composition is SiOCH. Since its final form is SiO(H), silazane requires removal and replacement of both N and C. On the other hand, 1,4-disilabutane requires removal and replacement of C only, and this does not complicate the replacement mechanism in post-treatment. The above is also considered a reason for the significant difference in film shrinkage.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a low-carbon silicon-containing film by CVD on a substrate having trenches, comprising:
    introducing a process gas into a reaction chamber, said process gas consisting of: (i) a gas of a silicon-containing compound having two or more silicon atoms and three or less hydrocarbon units in its molecule and having a boiling temperature of 35° C. to 220° C., wherein the silicon-containing compound includes a Si—R—Si bond where R is nitrogen or hydrocarbon, and has two to five silicon atoms in its molecule, and (ii) at least one gas selected from the group consisting of an inert gas, gas containing nitrogen in its molecule, and gas containing silicon in its molecule other than gas (i);
    applying RF power to the process gas; and
    depositing a film on a substrate having trenches by CVD using the RF power-applied process gas wherein the substrate is maintained at a temperature such that components of the silicon-containing compound are at least partially liquidified on the substrate, thereby filling the trenches with a material constituting the film,
    wherein gas (i) and gas (ii) are the only gases used in the reaction chamber during film deposition process under reduced pressure, and gas (i) is selected from the group consisting of 1,4-disilanebutane, cyclotrisilazane, and 1,4,7-trisilaheptane.

2. The method according to claim 1, wherein the hydrocarbon units are selected from the group consisting of $CH_2$, $CH_3$, $C_2H_4$, $C_2H_5$, $C_3H_6$, and $C_3H_7$.

3. The method according to claim 1, wherein the step of depositing the film comprises controlling the substrate to a temperature of −50° C. to 100° C.

4. The method according to claim 1, wherein the at least one gas comprises an inert gas.

5. A method of forming a low-carbon silicon-containing film by CVD on a substrate having trenches, comprising:
introducing a process gas into a reaction chamber, said process gas comprising a gas of a silicon-containing compound having three or less hydrocarbon units in its molecule and having a boiling temperature of 35° C. to 220° C.;
applying RF power to the process gas; and
depositing a film on a substrate having trenches wherein the substrate is maintained at a temperature such that components of the silicon-containing compound are at least partially liquidified on the substrate, thereby filling the trenches with a material constituting the film,
wherein the process gas further comprises an inert gas, and wherein a flow rate of the inert gas is decreased after the step of applying the RF power relative to a flow rate of the inert gas before the step of applying the RF power, and a pressure of the reaction chamber is increased after the step of applying the RF power relative to a pressure of the reaction chamber before the step of applying the RF power.

6. The method according to claim 5, wherein the decrease of the flow rate of the inert gas and the increase of the pressure begin substantially at or nearly at a moment of starting application of the RF power.

7. The method according to claim 5, wherein a decrease of the flow rate of the inert gas and an increase of the pressure begin after starting applying the RF power.

8. The method according to claim 1, further comprising in-situ oxidizing the film after the step of depositing the film in the same reaction chamber.

9. The method according to claim 8, wherein the in-situ oxidization is an oxygen plasma treatment.

10. The method according to claim 1, wherein the process gas consists of the silicon-containing compound and an inert gas.

11. The method according to claim 1, further comprising annealing the film as post deposition treatment to remove Si—H and C—H from the film.

12. The method according to claim 11, wherein the annealing comprises multiple different anneal steps.

13. The method according to claim 11, wherein a shrinkage ratio of the film before and after the annealing is less than 25%.

14. The method according to claim 1, wherein the process gas is introduced in pulses during the step of depositing the film.

* * * * *